United States Patent [19]

Kuehnle

[11] 4,026,787

[45] * May 31, 1977

[54] THIN FILM DEPOSITION APPARATUS USING SEGMENTED TARGET MEANS

[75] Inventor: Manfred R. Kuehnle, Lexington, Mass.

[73] Assignee: Coulter Information Systems, Inc., Bedford, Mass.

[ * ] Notice: The portion of the term of this patent subsequent to Aug. 13, 1991, has been disclaimed.

[22] Filed: Sept. 12, 1975

[21] Appl. No.: 612,859

Related U.S. Application Data

[60] Continuation of Ser. No. 436,444, Jan. 25, 1974, Pat. No. 3,905,887, which is a division of Ser. No. 322,968, Jan. 12, 1973, Pat. No. 3,829,373.

[52] U.S. Cl. .............................. 204/298; 204/192 D
[51] Int. Cl.² ........................................ C23C 15/00
[58] Field of Search ............................ 204/192, 298

[56] References Cited

UNITED STATES PATENTS

| | | | |
|---|---|---|---|
| 3,502,562 | 3/1970 | Humphries | 204/298 |
| 3,649,502 | 3/1972 | Herte et al. | 204/192 |
| 3,654,110 | 4/1972 | Kraus | 204/192 |
| 3,669,871 | 6/1972 | Elmgren et al. | 204/298 |
| 3,818,982 | 6/1974 | Wagner | 165/86 |
| 3,829,373 | 8/1974 | Kuehnle | 204/298 |
| 3,855,612 | 12/1974 | Rosvold | 357/15 |

FOREIGN PATENTS OR APPLICATIONS 367,074  2/1932  United Kingdom .............. 204/298

*Primary Examiner*—John H. Mack
*Assistant Examiner*—Aaron Weisstuch
*Attorney, Agent, or Firm*—Silverman & Cass, Ltd.

[57] ABSTRACT

Method and apparatus for coating a thin film upon substrate means in a pressure vessel using the plasma vapor deposition technique known as sputtering. The substrate means are arranged on the exterior of a cylindrical drum for rotation and have the convex surface thereof exposed to the plasma vapor during rotation. An assembly of a plurality of circumferentially spaced arcuate target segments forming generally a cylinder is arranged coaxially and telescopically with respect to the drum whereby to form an annular belt of plasma vapor cloud segments occupying the gap exterior of the drum between the target means and the drum. The target means comprise the cathode of the high voltage electrical circuit and the drum comprises the anode.

The projecting unit target area is larger than the unit exposed substrate area enabling radially converging plasma vapor and hence high rates of uniform coating.

The drum may rotate the substrate means in the belt repeatedly or serve as transport means to bring the substrate means through the belt on one pass. The cylindrical belt is not closed but has a discontinuance which is somewhat greater than the distance between target segments. The substrate means are led onto the drum from the exterior of the assembly of target segments and likewise led off the drum and conveyed to the exterior of the assembly of target segments by way of such discontinuance.

14 Claims, 15 Drawing Figures

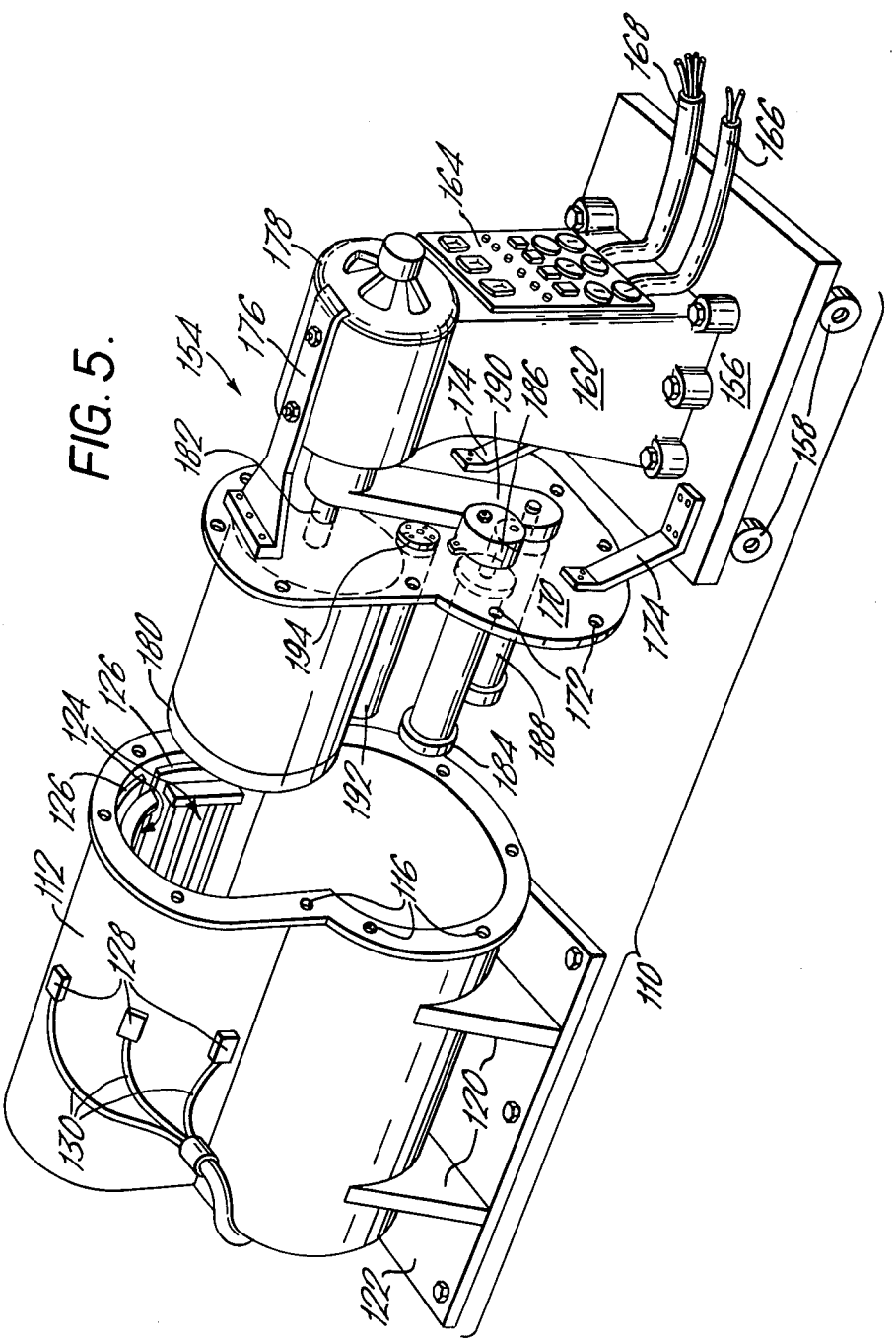

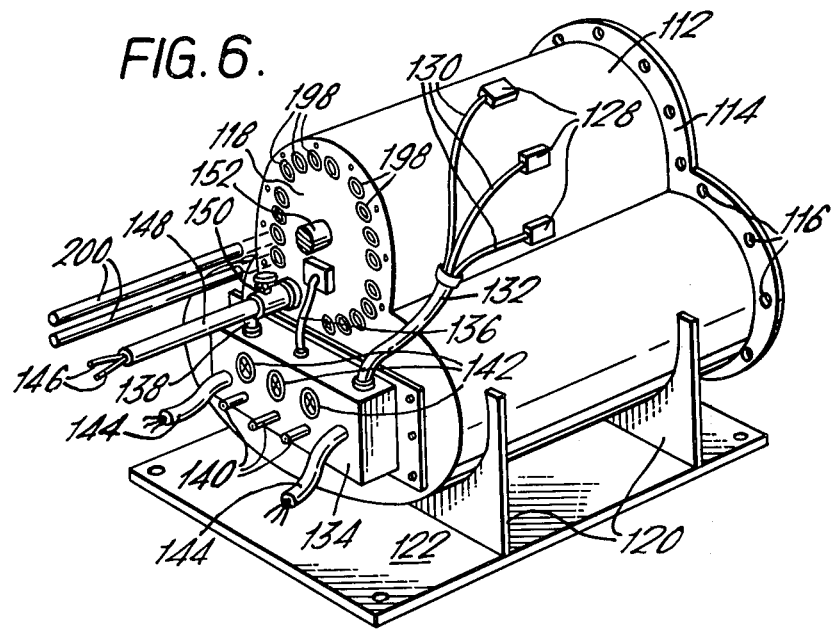
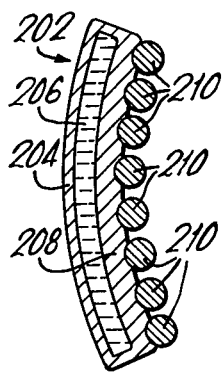
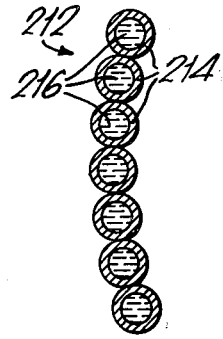
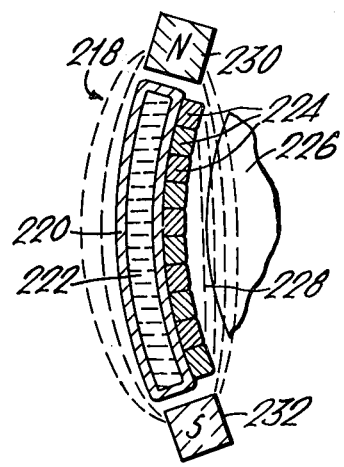
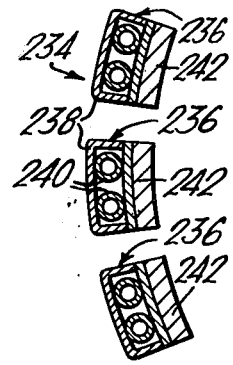

THIN FILM DEPOSITION APPARATUS USING SEGMENTED TARGET MEANS

CROSS-REFERENCE TO RELATED APPLICATIONS

This application is a continuing application disclosing and claiming only subject matter disclosed in my now pending application Ser. No. 436,444 filed Jan. 25, 1974, now U.S. Pat. No. 3,905,887, entitled "Thin Film Deposition Method Using Segmented Plasma" which in turn is a divisional application of my earlier application Ser. No. 322,968 filed Jan. 12, 1973 entitled "Thin Film Deposition Apparatus Using Segmented Target Means", now U.S. Pat. No. 3,829,373 granted on Aug. 13, 1974 and both owned by the assignee of this application.

Reference also is made herein to two patent applications filed by the applicant and assigned also to the assignee of this application.

The first application is Ser. No. 260,848 filed June 8, 1972 and entitled "Electrophotographic Film", now abandoned in favor of application Ser. No. 323,132 filed Jan. 12, 1973 and No. 378,180 filed July 11, 1973, both now abandoned, and Ser. No. 434,699 filed Jan. 18, 1974, now pending.

The second application is Ser. No. 323,133 filed on Jan. 12. 1973 and entitled "Method and Apparatus for Thin Film Deposition on a Substrate", now U.S. Pat. No. 3,884,787 granted May 20, 1975.

BACKGROUND OF THE INVENTION

The invention relates to the deposition of thin films on flexible substrate members such as plastic sheeting.

Known methods and structures for coating substrates are not economical or efficient to the extent that the invention herein teaches. Such known methods and structures have resulted in nonuniform and expensive product.

Generally a plasma vapor condition is established in a vacuum or pressure vessel and the substrate members are exposed to the vapor in batches. The plasma vapor condition is established between a member known as a target and a substrate mounting member. The atmosphere in the vessel contains some noble gas which is ionized and the ions bombard the target to drive atoms of the material out of the target to the substrate holding means. In the case of electrically established plasma vapor, the target is a cathode and the substrate holding means comprise the anode. Both are cooled. The material to be deposited is either conductive or nonconductive. In the case of nonconductive material, the plasma vapor must be established between the target and anode by means of radio frequency. In the case of conductive materials being deposited, the field may be either d.c. or r.f.

Known methods and apparatus for coating by this general technique have been characterized by low throughput principally caused by the construction of the apparatus in such a manner as not to be able to handle substrate at high rates of speed and in such a manner as not to deposit material uniformly and easily.

The most advantageous method of depositing is one in which the relationship between the projecting unit target area and the unit exposed area of the substrate is greater than one to one. Most commercial depositing apparatus and methods do not take advantage of this method and in fact have a relationship which is less than one to one. Typical are those structures in which a central target rod is fixed at the center of a coaxial rotating anode cage with small members of substrate exposed on the interior surface of the cage. In this latter type of structure it can be appreciated that the plasma vapor cloud thins as it approaches the substrate members. One to one relationship arrangements occur in laboratory or small batch operations only, so far as is known, where the target is a planar plate and the substrate is arranged parallel with the plate. The plasma vapor drives the particles of the target material to the substrate member principally in approximately parallel paths.

Some work has been done using the advantageous arrangement which is inherently capable of depositing at high rates, but such work has been deficient in many respects. So far as known, none of it has resulted in any commercially feasible sputtering. The basic concept is that of providing a central substrate-carrying drum which rotates within a cylindrical target so that the ratio of projecting unit target area to unit exposed area of the substrate is substantially greater than unity. Structures which disclose this concept are found in U.S. Pat. Nos. 3,282,816; 3,528,902; 3,314,873. In U.S. Pat. No. 3,314,873 the articles being coated pass through near the center of a cylindrical target without rotating, but moving lengthwise.

According to the invention as described in detail herein, specific examples of which are set forth in application Ser. No. 323,133, practical apparatus and methods are disclosed which enable maximum advantage to be taken of the technique in which the above-mentioned ratio is substantially more than unity.

Before further discussing the problems which have been solved and describing the advantages of the invention, it would be helpful to define some of the terms and expressions to be used hereinafter.

DEFINITIONS OF TERMS

The expression "thin film" as used herein is intended to mean a layer of some substance such as the semiconductor materials or ohmic layers referred to in the first copending application, applied to a surface. Such a thin layer is one which has a thickness measured in hundreds or thousands of Angstroms, such as for example the layers in the said first copending application which are 500 A to 5000 A. It will be noted that 1 micron is equal to 10,000 A. The techniques and apparatus which will be described and claimed hereinafter make it feasible to deposit thin film layers upon substrate means, such layers being of the order of small fractions of microns.

Reference will be made herein to "photographic film." This will be used to describe a complete article of conventional construction which includes a base of some plastic material such as sheeting carrying an emulsion of silver salt coating or the like. The article which is produced by the methods and apparatus of the invention can be used as a photographic or electrophotographic film if the thin film or thin films are of certain materials or combinations of materials deposited on plastic sheeting or plastic strips.

The word "film" with its generic meaning as a thin coating will be avoided hereinafter in order to prevent confusion. The word will be used only with modifying adjectives. While the substrate which is coated with thin film according to the invention may be in most cases called a "film" since it is very thin and flexible, it will be referred to herein as a substrate, a substrate member or substrate means. In the case of the electrophotographic film of the first copending application, the substrate is a strip of plastic sheeting which is of the order of 0.125 millimeter. An organic polymer such as flexible polyester is used for its insulating property, durability and flexibility. The invention herein is not necessarily limited to such substrate, although it will be detailed primarily for the purpose of producing such electrophotographic film.

The invention herein is primarily concerned with the coating of thin films upon thin flexible substrate members in an atmosphere of some inert gas such as argon using a thermal phenomenon which is known as plasma vapor deposition. Similar techniques may use nonelectrical apparatus, but according to the invention herein the plasma is created electrically, the method being known as "sputtering" and referred to as such hereinafter.

Reference herein to "plasma" will mean an ionized gas created in a d.c. or radio frequency a.c. field for the purpose of sputtering atoms from a target onto a substrate. The word "vapor" as used herein will mean a cloud of atomic particles created in a low pressure atmosphere by means of an ion bombardment effect, the vapor condensing or being driven to condense on the substrate surface. Accordingly, "plasma vapor" means the cloud of particles created by sputtering. For clarity, reference will be made to "plasma vapor clouds" notwithstanding the seeming redundancy, to avoid using the expression "plasma vapors."

The expression "projecting unit target area" as used herein means the area of any unit of the target surface which is capable of emitting atoms of the target substance to form the plasma vapor which is to be driven to the substrate carrier. The path of plasma emitted from such a target area if defined and confined by that area and by surfaces which are normal to the target surface will generate a solid extending to the substrate carrier. This solid will have a geometry which is thus determined by the topography of the target surface. If the surface is a flat plane, the plasma solid everywhere will be identical in cross section to the unit area at the target surface. If the surface is concave, the plasma vapor cloud will decrease in cross-sectional area with distance from the emitting area. It is assumed for these examples that the curved plane at which the cross-sectional area is measured is everywhere substantially equidistant from the emitting surface.

The expression "unit exposed substrate area" as used herein is intended to mean that area of the exposed substrate surface which will be "illuminated" or subtended by the plasma solid projected from the projecting unit target area intersecting with the substrate surface. Again, the topographies of the target surface and the substrate surface will control what the unit exposed substrate area is.

These last two expressions are not used in the art, so far as known, but have been evolved to simplify the explanation of the invention and the understanding thereof. The first expression "projecting unit target area" represents a measurement which is independent of the second, but the second is a measurement which will always depend upon the topography of the target surface.

According to the invention, the emitting target surface is generally cylindrical and concave so that the emitting plasma solid decreases in cross-sectional area with distance away from the target surface. The substrate surface lies on a coaxial cylinder so that the emitting plasma solid will have a projecting target area that is smaller than the area of the target surface which defined the larger end of the solid. Thus, we can say that the ratio of projecting unit target area to unit exposed substrate area is greater than unity. In the case that the target surface and substrate surface are planar and parallel, the ratio is unity. In the case of prior art setups where the target is a central tubular member and the substrate members are exposed on the inner surface of a rotating cylindrical cage coaxially arranged around the central tubular target, the ratio is substantially less than unity.

As mentioned above, the instances where arrangements are such that the ratio is unity are unusual, being known only in laboratories. So far as known, the invention herein teaches for the first time practical methods and apparatus to achieve the substantially greater than unity rations, resulting in larger deposits of thin film in shorter times than heretofore. The problems represented by prior proposed structures using fully enclosed right cylindrical targets are manifold. It is believed that the absence of solution has delayed the use of the basic concept until the advent of the invention herein.

The structure of the invention has the target means formed of a plurality of segments circumferentially spaced around the drum and defining a cylinder, but there being a relatively large space between two of the segments, preferably at the bottom of the defined cylinder. In this manner there is a segmental plasma vapor cloud formed by each segment in the gap between that segment and the drum. Such clouds are described herein as forming an intermittent annular belt which is generally cylindrical and coaxial with the drum but has a discontinuance where there are no segments of the target means. The elongate substrate member is led from a source outside of the target means assembly into the interior thereof, into engagement with the drum and hence with its exterior surface forming an interface between the plasma vapor belt and the substrate, around the drum and back out of the target means assembly. In so passing, in and out, the substrate member moves by way of the discontinuance of the belt. While usually larger than the angular distance between target segments, the discontinuance could be the same size or smaller. It is required only to pass the substrate.

With a full cylindrical target sputtering gas enters and leaves only at the ends of the target, producing nonuniform plasma vapor in the gap. Segmentation permits the gas to circulate from side to side across the narrow width of the target segments, giving highly uniform plasma vapor distribution. Cylindrical targets are difficult and expensive to manufacture by stamping, sintering and the like processes. This is not true for segmented target members. With full cylindrical targets, the entire target or at least the target surface is practically required to be made out of one material. With segmented target means, target segments of different materials can be used. Furthermore, they are readily replaced and adjusted for perfect concentricity relative to the drum even as the target is consumed. The r.f. field is capable of being perfectly adjusted also so that its distribution can be controlled within narrow limits. Energy distribution to the individual target segments can be adjusted as desired to alter and control the deposition rate at will.

In connection with the replaceability of the individual target segments, the rate of consumption of different material segments differs. With the segmented arrangement, target members that have been consumed can be replaced without disturbing the other target segments. The end loading construction of the invention is a highly effective way of quickly and economically doing this.

It is appreciated that with a complete cylinder it is not possible to lead the substrate into the interior of the cylinder and out while rotating the drum. The segmentation of the cylinder into individual members makes this a simple matter.

Sputtering of the type which is going to be used to deposit thin films on substrate members must be closely controlled. The sensors of control instruments are most effectively positioned immediately at the substrate surface at multiple locations around the circumference of the drum and immediately at the plasma vapor belt. The spacing of the segments of the target means permits optimum location of such sensors which, of course, is not possible with a complete cylinder.

Other advantages of segmented target means over the whole cylindrical structure include the enabling of magnet bars to be placed in the spaces between segments to facilitate the removal of secondary electrons from the plasma vapor belt during the sputtering process.

SUMMARY OF THE INVENTION

According to the invention, a method and apparatus for the coating of thin film on substrate material are disclosed in which a vapor plasma cloud belt of spaced segments is established which is generally arcuate in its configuration. The substrate means are arranged to move in a configuration which is also arcuate, the curvature of the path of movement of the substrate means and the curvature of the configuration of the segmented target means which gives rise to the plasma belt being generally coaxial. A typical structure will have the substrate means engaging upon the outer surface of a cylindrical drum that is being rotated to expose the substrate means to plasma vapor which engages around a substantial portion of the exterior of the drum. The target means on the other hand are formed of a plurality of spaced segments defining the major part of a cylinder with the interior of the cylinder spaced from the exterior of the drum to provide the sputtering gap means and the axis of the target means cylinder being substantially identical to the axis of the drum. The circumferentially spaced members forming the target means may be readily individually replaceable.

The plasma vapor cloud belt of spaced segments is formed between the inner surface of the target means and the exterior surface of the drum, and since the latter carries the substrate means, the projecting unit target area is larger than the unit exposed substrate area on account of the radially converging plasma vapor. Each segment of the belt is individual to the respective members forming the target means.

BRIEF DESCRIPTION OF THE DRAWINGS

FIG. 5 is an exploded view of substantially a complete apparatus constructed in accordance with the invention, the same being generally a modified form of the apparatus with which the structure of FIG. 4 is intended to be used;

FIG. 6 is a fragmentary perspective view of the apparatus of FIG. 5 taken from the end of the pressure vessel which cannot be seen in FIG. 5;

FIGS. 7, 8, 9, and 10 are sectional views through different forms of targets which can be used with the apparatus of the invention, FIG. 9 also showing a modified form of magnetic structure for eliminating secondary electrons from the plasma vapor gap;

DESCRIPTION OF THE PREFERRED EMBODIMENTS

Figure 1:
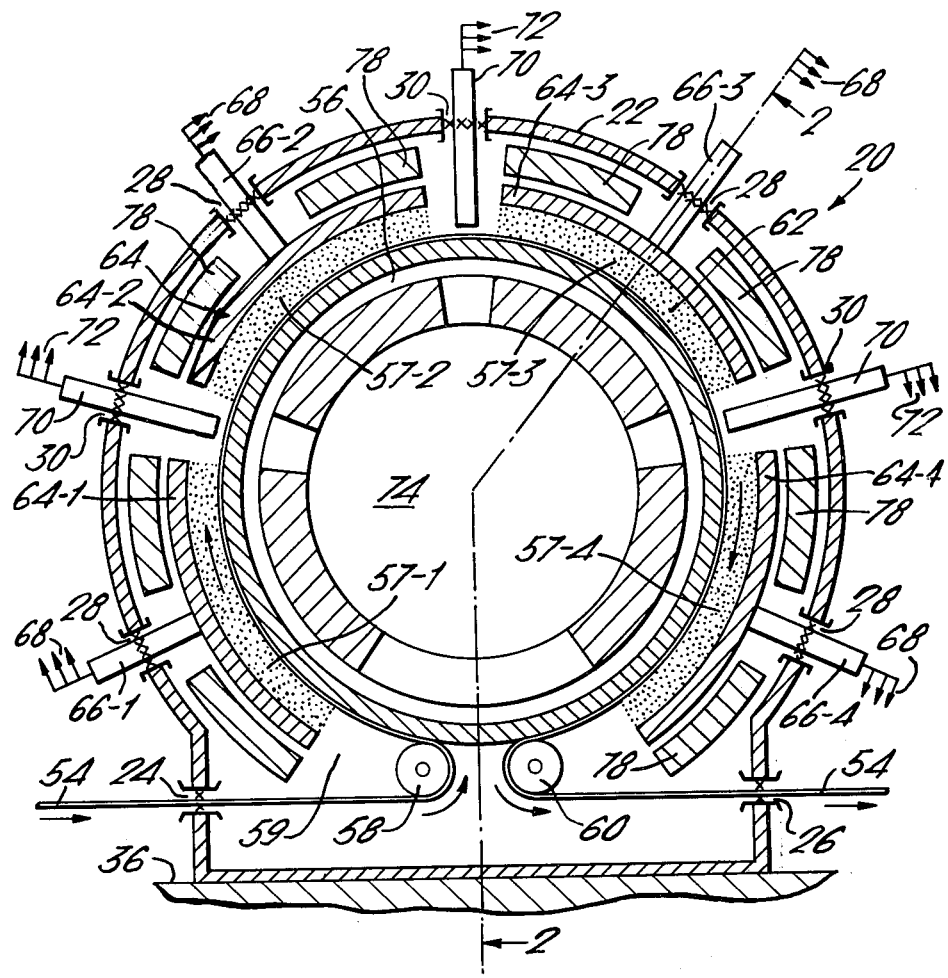
FIG. 1 is a diagrammatic sectional view taken through a thin film deposition apparatus constructed in accordance with the invention for the continuous coating of an elongate substrate member.

Basically the invention comprises forming a belt of plasma vapor clouds in the form of segments of a cylinder which are circumferentially spaced. There is a discontinuance in the cylinder belt which may be somewhat larger than the spaces between segments and substrate means in the form of an elongate member enters by way of the discontinuance, passes around the interior of the cylinder of segments and in sputtering relation to said segments. In the course of said passage the substrate means follow a cylindrical path which is coaxial with the axis of the cylinder of vapor plasma cloud segments. Thereafter, after having made one or several turns, the substrate means passes out of the cylinder through the same discontinuance.

According to a preferred form of the invention, the belt of plasma vapor clouds is formed between target means and the substrate carrier. The target means comprise a plurality of elongate target members spaced apart circumferentially and arranged in an arc, forming almost a complete cylinder. The substrate carrier is a rotating drum that is substantially coaxial with the arc formed by the target members. The plasma vapor is formed by sputtering, there being a high voltage electrical field between the target means and the drum. In the case of depositing thin films which are not necessarily conductive or of multiple materials radio frequency a.c. is used to establish the field, and in such cases, the target means and the drum are tuned to the radio frequency by external condensers. The present frequency designated in the U.S. for sputtering equipment is 13.56 megahertz.

The drum and the target means are disposed on the interior of a pressure vessel in which the plasma vapor condition is established. A simple structure has a supply of substrate on one reel and a take-up reel for the substrate, both reels being also disposed on the interior of the pressure vessel. The substrate, in the form of an elongate strip or ribbon, is led around the drum to be subjected to the plasma vapor condition. The entire structure comprising the drum and reels is mounted to a closure for the vessel so that the opening of the vessel and movement of the closure will withdraw the structure, thus giving access to the principal components of the apparatus. Various connections and drives are carried by the closure, as will be explained.

Another structure has the substrate member in the form of an elongate strip or ribbon entering and exiting through suitable pressure locks provided in a wall or walls of the vessel. This arrangement would be suitable for a substantially continuous process requiring less frequent dissipation of the pressure condition on the interior of the vessel than in a batch process.

In the sputtering process a hermetic vessel is evacuated to a fairly low pressure such as of the order of $10^{-7}$ torr and then filled with an inert noble gas such as argon to a pressure of about 60 millitorr. The vessel is provided with the target means or cathode insulatingly mounted therewithin, at least the surfaces of the target means are made out of the materials or a component or components of the material which is to be deposited on the surface of the substrate member. The anode is the substrate carrier or, according to the invention, the substrate transport means. A high voltage field is established between the target and anode, such field being either a.c. or d.c. and in the kilovolt range.

The action in the vessel takes place primarily in the gap between the target means and the anode. The high voltage field ionizes the argon gas and drives the ions against the target means. The atoms of materials from which the target members are made are literally knocked from the target members and form clouds which are driven by the field toward the anode. Each target member produces or subtends a single plasma vapor cloud. The atoms settle onto the anode, but since the substrate is carried upon the anode, they settle on the surface of the substrate member. The temperatures involved are quite high, and both the target members and the anode have to be cooled by circulating coolant. Water is usually sufficient, but liquid gases can be used.

The vessel has many connections to the exterior thereof, these connections being required to pass through the walls in pressure-tight condition. Pressure locks must be used. The connections provide many functions including transportation of coolant; measuring and sensing of temperatures, pressures and the like by way of suitable transducers connected by electrical leads; conveyance of high voltage power for establishing the high voltage field; bringing of voltage connections into the interior of the vessel for operating motors and the like; transmitting mechanical movement such as rotation and the like into the interior of the vessel for rotating the drum and takeup reel, for example; conduits for evacuating the interior chamber, for introducing and maintaining the pressure of the argon or other noble gas, for introducing dopant and other gases needed during the process; and the like.

One form of target member if formed of a metal base or backing having a surface layer or laminate of the material or a component of the material which is to be sputtered. In the first-mentioned copending application the electrophotographic film there described has a thin film deposited on a sheet member of thin plastic, the thin film comprising n-type cadmium sulfide, zinc indium sulfide or the like. The resulting thin film is flexible, transparent, inorganic, photoconductive and electrically anisotropic. In the case of cadmium sulfide, the target surface would comprise cadmium and the sulfide could be introduced into the chamber as a dopant sulfidic gas from a suitable source in suitable proportions so that the thin film deposit would be stoichiometrically correct. In the case of zinc indium sulfide, the zinc and indium would be in an alloy formed as the target surface layer or could be alternate bars of zinc and idium, the sulfur being again admitted in gaseous form. The said electrophotographic film has characteristics enabling it to be used in many cases in place of conventional high speed photographic film but with many advantages over such photographic film.

The above discussion will provide sufficient basis to follow the details set forth hereinafter.

Figure 2:
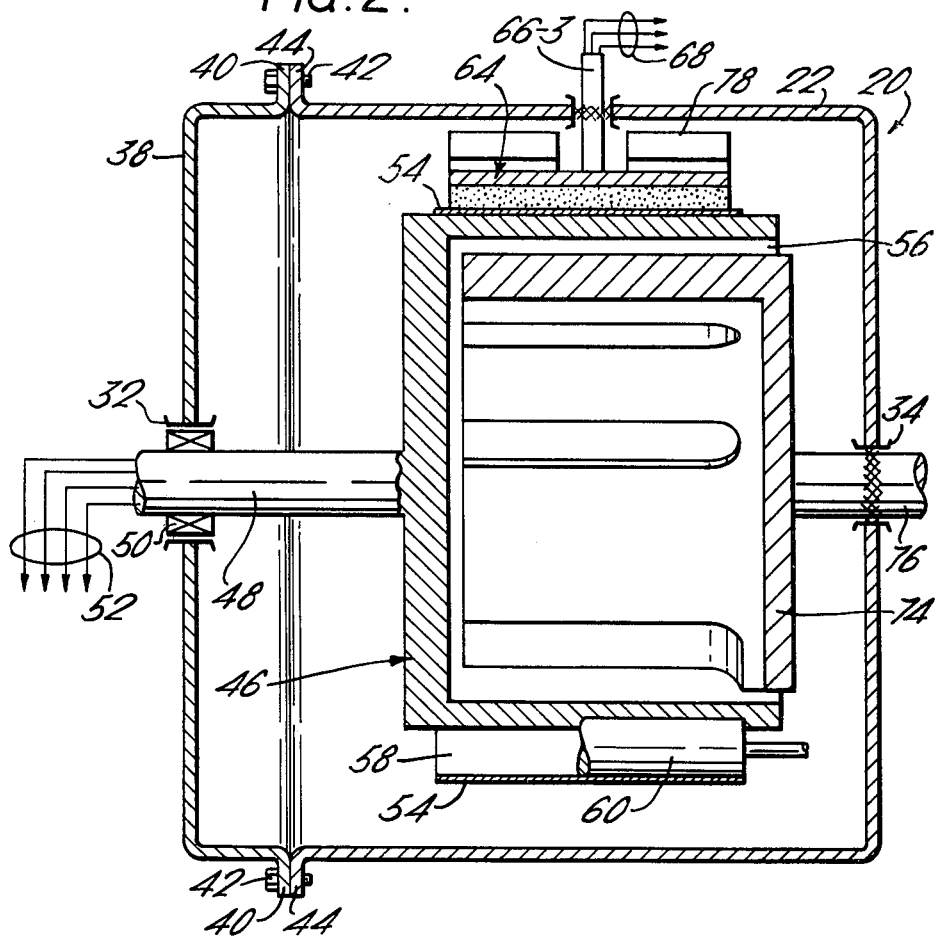
FIG. 2 is a diagrammatic sectional view taken generally along the line 2—2 of FIG. 1 and in the indicated direction.

In FIGS. 1 and 2 there is illustrated in section an apparatus 20 which is intended for continuous thin film coating. There is a pressure vessel 22 which is made of some material capable of containing the pressures encountered and resisting chemical reaction with the atmosphere encountered during the processing. Pressure-tight locks are shown for the various connections to the interior of the vessel, these being indicated symbolically at 24, 26, 28, 30, 32, and 34. These connections pass through the walls as shown which can be made out of stainless steel, heat resistant glass or the like. The vessel 22 is highly simplified in the drawings and is shown supported on a platform or base 36.

At one end of the vessel 22 there is a closure 38 which is flanged at 40 and suitably gasketed (not shown) to enable a pressure-tight removable connection to be made by some fastening means 42 to the flange 44 formed on the end of the vessel 22. Connections may be made through the closure in addition or instead of through the walls of the vessel 22. One such connection is shown in FIG. 2. The drum 46 on the interior of the vessel 22 has a shaft 48 mounted on the bearings 50 passing through the pressure-tight lock 32 and being connected to a suitable rotary device such as a motor (not shown). Various electrical and coolant conduits passing through the hollow bore of the shaft 48 are shown at 52. The cylindrical portion of the drum 46 serves as the support and transport means for the substrate member 54. Its right-hand end is open as shown in FIG. 2 providing a cylindrical chamber 56.

The substrate member 54 in this case is a wide strip of some thin material, such as for example, plastic sheeting. It is desired to coat the surface thereof, in this case being the upper surface as viewed in FIG. 1. The substrate member 54 is led from some supply source outside of the vessel 22 through the pressure-tight lock 24 and engaged around a roller 58 and pressed against the exterior surface of the drum 46. The substrate member 54 passes around the drum 46 which is rotating as indicated by the arrows of FIG. 1. The substrate member 54 then passes around another roller 60 and out through the lock 26 to a take-up device (not shown) where it is accumulated.

In the course of passing around the drum 46, the outer surface of the substrate member 54 is coated with a thin film, the inner surface being protected by the body of the substrate member 54 itself and being held tightly pressed against the exterior surface of the drum 46. This thin film coating is achieved by means of a plasma vapor condition established in the gaps 62 between the target means 64 and the drum 46.

The target means 64 in this embodiment 20 comprise four arcuate target members 64-1, 64-2, 64-3 and 64-4 disposed in a generally cylindrical configuration around the drum with the axis of the target cylinder coinciding with the axis of the drum 46. Accordingly, the gaps 62 define a generally annular form which everywhere has the same radial dimension.

The target members are shown mounted on structural members that are representative or symbolic of means to mount the target members for mechanical adjustment and to provide electrical and similar connections thereto. Thus, the target members 64-1 to 64-2 are shown provided with the structural members 66-1, 66-2, 66-3 and 66-4, respectively. These members pass through the vessel walls by way of the pressure-tight locks 28 and are hollow. The electrical lines, conduits, mechanical connections and the like which pass through the structural members or are associated with such structural members are designated 68. It will be appreciated that at least the following functions relate to the target means 64: (a) coolant must be circulated on the interior of the target members to keep their temperatures constant and controlled, (b) high voltage connections must be provided and connections for exterior tuning must be provided in the event that the plasma vapor is produced by raido frequency, (c) mechanical adjustment of the target position must be achieved for proper placement and for change of placement as the target members are consumed. In some apparatus, complete withdrawal of the target member is possible for replacement without opening the vessel.

Control of the pressure, temperature and the like must be maintained and hence there is a plurality of sensors inside the vessel 22 connected to instruments and control means on the exterior to achieve such control. The sensors are represented in FIG. 1 by devices 70 strategically placed in the vessel interior, passing through the pressure-tight locks 30 and having external lines leading to measuring devices and control means as indicated at 72. Because of the segmented arrangement of the target means 64, these sensors 70 are brought very close to the substrate surface in the spaces between target members. The measurements made are thus very accurate and at many locations not otherwise available.

The target means 64, as stated above, comprise the target members 64-1, 64-2, 64-3 and 64-4. These members are formed in this embodiment as arcuate segments of a cylinder, the segments being elongate, that is their longer dimension is parallel with the axis of the cylinder which they define. Of course it is not essential that this relationship be maintained according to the invention, but it is probably best for economy. As a matter of fact, each of the segments could be made up of several parallel members engaging side by side or even slightly separated, and all not necessarily being of the same material either wholly or on their surfaces. Likewise, although only four members are used in this embodiment, there could be more or less.

Such target members as shown are easily manufactured. They are readily cast, sintered or molded. Because they are relatively flat they can even be stamped, as opposed to targets which are formed as whole cylinders. Hollow targets are easily fabricated by welding shaped members.

The target members produce individual plasma vapor clouds which are shown in FIG. 1 by stippling at 57-1, 57-2, 57-3 and 57-4. Each cloud is a segment having the same configuration as the gap 62 which exist between the respective target members and the drum 46. The cloud produced by each target member does not fringe beyond the borders of the target member; hence it could be said that the cloud segment is subtended by the target member. This is convenient for several reasons which have been mentioned, including the placement of the sensors and the placement of magnet bars which will be described later in connection with FIG. 9.

The cloud segments 57-1 to 57-4 form a cylindrical belt of plasma vapor with its individual members slightly spaced apart circumferentially, the cylinder being coaxial with the cylinder defined by the target means and the drum. There is a discontinuance 59 in the plasma vapor cloud belt at the bottom thereof which may be substantially larger, that is, or greater angular extent, than the spaces between the parts of the belt. As noted above, the substrate member 54 enters within the belt and leaves the belt by way of this discontinuance. In the sputtering operation the surface of the substrate member 54 which is being coated forms and interface between the body of the substrate member 54 and the plasma vapor clouds. The plasma vapor condition is established in the gaps 62 which are equal in number and in radial dimension to the plasma vapor clouds. Obviously during the sputtering process, where necessary to maintain uniform deposit and r.f. field conditions the individual target members may be adjusted to vary the width of the respective gaps 62, but generally, if components are accurately manufactured the gaps will be substantially the same radial thickness initially.

A magnetic field is established across the gaps 62 to drive secondary electrons out of the gaps. This can be achieved by providing permanent magnets adjacent the gaps on axial ends of the target members 64-1 to 64-4 or can be achieved by the means shown in FIGS. 1 and 2 or in FIG. 9. In this instance the magnetic field is radially disposed relative to the drum 46 and target means 64. A central slotted cylindrical magnet 74 enters the cylindrical chamber 56 formed in the center of the drum 46 and is held in position by the shaft 76 that is secured to the right end wall of the vessel 22. This is shown passing through the pressure-tight lock 34 formed in the wall. The magnet 74 cooperates with a plurality of arcuate magnets 78 arranged around the target means 64 and coaxial with the drum 46.

The secondary electrons which are produced by the plasma vapor impinge against the substrate and heat it without useful function. The structure described drives the electrons out of the gaps 62 axially to the open spaces in the vessel where their energy is dissipated harmlessly, keeping the substrate member 54 and drum 46 cooler than if permitted to engage the same.

The field across the gaps 62 can be established by bar magnets adjacent the target members as explained in connection with FIG. 9. The structure is simpler and more compact than that of FIGS. 1 and 2.

The advantages of arcuate target means are achieved in a practical arrangement according to the invention by forming the target means of spaced segments to the end that a belt of plasma vapor cloud segments extends around the drum 46 to establish the deposition condition. An appreciation of the high deposition rate will be understood from FIGS. 3A and 3B.

Figure 3A:
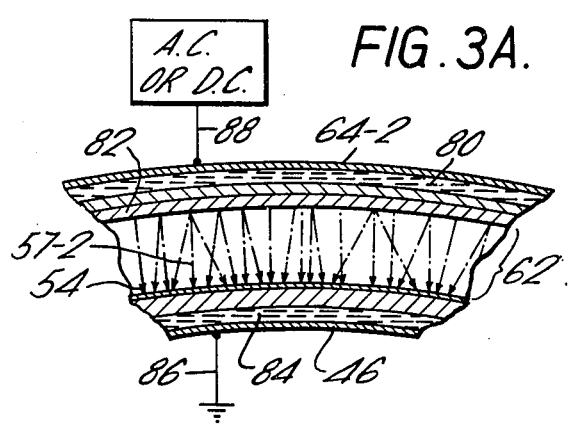
FIG. 3A is a fragmentary diagrammatic sectional view on an enlarged scale, somewhat exaggerated, used in explaining the theory of operation of the invention.

First examining FIG. 3A, a fragmentary section through the apparatus 20 shows a target member, such as for example 64-2, which is shown having an interior manifold or hollow 80 filled with a coolant that is circulated. The inner surface of the member 64-2 is clad with a plating or laminate 82 of the metal or other material that is to be deposited. The drum 46 has an interior manifold or hollow 84 also filled with a coolant that is circulated. A substrate member 54 is shown on the convex surface on the drum 46 being subjected to the plasma vapor cloud 57-2 that is generated in the gap 62 between the target member 64-2 and drum 46. The high voltage potential between the target member and the drum is represented by the drum being grounded at 86 and the target member being connected to a high potential source at 88.

The atoms knocked out of the target laminate 82 are driven across the gap 62 and while the general paths are not precisely radial, as indicated by the broken arrows, the radially moving atoms give a good measure of the deposition phenomena. Obviously, if all of the particle movement was radial, it can be seen that there would be a crowding of the paths as they approach the surface of the substrate member 54 because the curvature of that member is less than the curvature of the target member laminate 82.

Figure 3B:
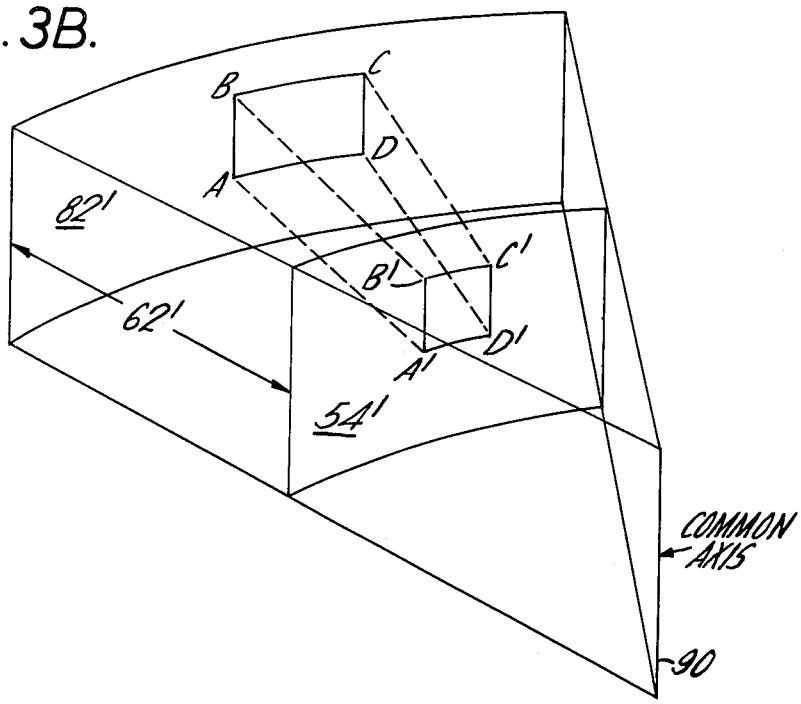
FIG. 3B is a geometric diagram used in explaining the significance of some of the expressions used in the specification.

As shown in FIG. 3B, consider an arcuate plane surface 82' equivalent to the outer surface of the laminate 82 which is a portion of a cylinder whose axis is at 90. Another arcuate plane surface is shown at 54' corresponding to the outer surface of the substrate member 54. Again the surface 54' is a portion of a cylinder whose axis is also at 90 but whose diameter is less than the diameter of the previously mentioned cylinder. The radial difference to one side of the axis is the distance 62' which is equivalent to the gap 62. A given increment of area ABCD on the surface 82' projected radially onto the surface 54' will produce an incremental area A'B'C'D' in which the vertical dimension A'B' equals the dimension AB and the vertical dimension C'D' equals the dimension CD. As for the circumferential dimension of the resulting areas, it is obvious that the dimensions A'D' and B'C' are substantially less than the equivalent dimensions AD and BC.

Assuming that the incremental area ABCD emits particles normal to the surface 82' it is clear that all of these particles will have to be concentrated into the incremental area A'B'C'D' which is smaller. If the surfaces 82' and 54' were parallel the distribution of particles on the incremental area A'B'C'D' would be identical to the distribution of particles leaving the area ABCD. If the particles were emitted from the same incremental area ABCD but projected on a surface that was part of a cylinder having a curvature greater than that of the surface 82' (for example, from the area A'B'C'D' projected onto the area ABCD) the concentration of particles would be substantially less than the concentration of particles leaving the projecting area.

The unit area of the projecting surface is called the projecting unit area and in FIG. 3B it corresponds to the area ABCD. The projected image of that area onto the surface which will receive the particles is called the unit exposed substrate area and in the case of FIG. 3B it corresponds to the area A'B'C'D'.

It is seen that the ratio of the first of these areas to the second is substantially more than unity, which gives a high deposition rate that is very advantageous in sputtering apparatus. The invention enables advantage to be taken of this method of deposition.

Figure 4:
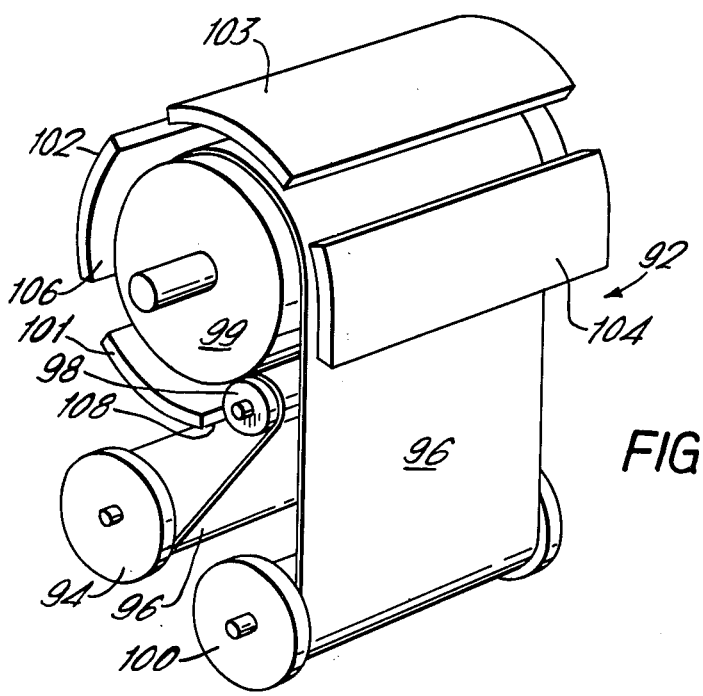
FIG. 4 is a perspective view of a portion of apparatus constructed according to the invention for coating a substrate member on a reel to reel arrangement on the interior of the pressure vessel of the apparatus, said vessel not being shown in this view.

In FIG. 4 there is illustrated a part of an apparatus 92 which is adapted especially for coating thin film on relatively wide substrate members. Here there is a supply reel 94 from which the substrate member 96 is passed over a roller 98 and into engagement with the drum 99, around the drum 99 and straight downward to the take-up reel 100. The target means comprise four target members 101, 102, 103 and 104 having a general construction similar to those previously described. In this case, the members 101, 102 and 103 are arcuate and quite similar. The member 104 is not quite as curved as the other in order to enable the substrate member 96 to pass from the drum 99 tangentially thereby eliminating the need for another roller equivalent to the roller 98. The target members 101, 102, 103 and 104 are spaced from the drum to form the gaps 106 within which the plasma vapor cloud segments will be produced. These segments form a belt which is substantially cylindrical around the drum with some slight distortion at the target member 104. The belt is nonetheless arcuate and close to cylindrical. The discontinuance in the belt is designated 108 and it occurs between the target members 104 and 101. The substrate member 96 enters and leaves through this discontinuance.

FIGS. 5 and 6 illustrate a practical design for a sputtering apparatus constructed according to the invention.

The appartus of FIGS. 5 and 6 is designated 110 and it is assumed that the basic type of sputtering apparatus is that of FIG. 4 but with a different form of target means. In other words, the type of substrate member involved is a relatively wide one and it makes one pass around the drum. In FIG. 5 the separated parts of the apparatus 110 are illustrated during a period of time in which the apparatus is being serviced or the like. The stationary part is shown on the left of FIG. 5 and the movable part is shown on the right. The stationary part includes a pressure vessel 112 which is open at its right-hand end and is provided with a flange 114 suitably perforated throughout its extent at 116 to cooperate with bolts or other fasteners such as those shown at 42 in FIG. 2. Any quick-acting but robust fastening means are suitable. The left-hand end of the vessel 112 has a wall 118 which is shown in FIG. 6 and will be described hereinafter. The vessel 112 is mounted on brackets 120 which in turn are secured to a rigid base 122.

The target means 124 can be seen on the upper interior of the vessel 112, such target means being of a type to be described in detail and made up of a plurality of elongate bars or strips arranged in the same general configuration as the members of FIG. 4. Thus, an upper curved section equivalent to 103 can be seen partially and a lower section equivalent to the member 104 is partially visible. The remainder of the target means cannot be seen in FIG. 5.

Magnetic members similar to those of FIGS. 1 and 2 are also visible in the view. The members are designated 126 and they are equivalent to the members 78 of FIGS. 1 and 2.

Sensors mounted on the interior of the vessel 112 are located at a suitable critical points on the inside of the vessel and conduits and/or electrical conductors leading to the same emerge from the vessel 112 at various places. For example, junction boxes or housings which provide pressure-proof transmission through the wall of the vessel 112 are shown at 128 with such conduits or conductors 130 extending to a large cable 132 which in turn enters an instrument and control panel 134. Other sensing means for assisting in control of the sputtering operation could be located at different points in the interior of the vessel and in order to indicate this, additional cables are shown at 136 and 138 also leading to the instrument and control panel 134. The instrument and control panel 134 may also provide for the pressure-proof connections for pumping down the vacuum, introducing the ionizing argon or the like gas, introducing dopant or thin film component gases, etc. Several pipe connections are shown at 140 with valve controls at 142. The actual instruments or automatic control apparatus may be located elsewhere so that the instrument panel 134 serves primarily as a large junction housing, cables being shown at 144 conveying electrical leads and/or conduits elsewhere. Coolant required to be introduced could come into the vessel by way of circulating conduits 146 suitably insulated at 148 and entering the vessel 112 through a junction and valve connection 150.

The support for the central magnetic member equivalent to the magnetic member 74 of FIGS. 1 and 2 is provided at 152, shown entering through the wall 118 at this point. Other apparatus within the vessel could be supported by this member or other means entering or connected to the rear wall 118.

As for the movable portion of the apparatus 110, this is designated generally 154 and is shown mounted on a dolly or carriage 156 that has rollers 158 to enable it to be moved relative to the vessel 112. A large stand 160 rigidly secured to the carriage 156 has an instrument panel 164 which may have switches, instruments and control dials. Sensors which are connected to the part 154 of the apparatus 110 and structure which is mounted to said part 154 including motors and the like are monitored, controlled and operated through the means of this panel 164. Cables, conduits and connections from the panel may lead elsewhere as indicated at 166 and 168, including coolant conduits, electrical power leads, control signal lines, etc.

The closure 170 which has openings 172 for cooperation with the openings 116 to seal the chamber within the vessel 112 is mounted to the carriage 156 in any suitable manner. Just by way of example, connecting brackets are shown at 174 and 176 extending from the closure 170 to the base of the carriage 156 and to the top of the stand 160 which may house a motor 178. The drum 180 is mounted on the closure 170 for rotation by the motor 178 through a suitable drive such as a shaft 182. The storage reel 184 is also mounted on the closure 170 and may be connected to a suitable drag mechanism such as a clutch indicated symbolically at 186 mounted on the exterior of the closure. The take-up reel 188 is mounted on the inside of the closure 170 and driven through suitable drive means from the motor 178. For example, a take-off from the shaft 182, comprising chains or belt or gearing is indicated by the housing 190 for such take-off mounted on the exterior of the clousre 170. The roller 192 is secured for idling to the closure 170 at 194.

The substrate member 196 (equivalent to 96) is originally wound on the storage supply reel 184 (equivalent to 94) and in being coated with a thin film passes over the pinch roller 192 (equivalent to 98) around the drum 180 (equivalent to 99) and onto the reel 188 (equivalent to 100). Obviously, the plasma vapor condition within the apparatus 110 is established when the two parts are assembled.

In FIG. 6 it is noted that the end wall 118 has an arrangement of sockets in groups. These are closed ends of sockets and they are designated 198. No particular type of closing structure is shown but it is to be understood that any pressure-tight arrangement can be used so long as the bars or rods which enter the respective sockets can be replaced when desired. Two such rods are shown at 200 in an exploded position aligned with their respective sockets. Cooling means are not seen in this view but the target bars will be cooled.

As previously mentioned, the target means conveniently are made of a plurality of bars or rods forming an assembly. FIG. 7 shows such an arrangement in which the target means component 202 is arcuate and forms a segment of a cylinder, the view being the cross section. Several of these will be arranged around a drum to define a cylinder or at least the major portion of a cylinder, much like the target means 64 of FIG. 1 or the target means 101 to 104 of FIG. 4. The structure 202 illustrated in FIG. 7 comprises a component which is the equivalent of a single member like 64-1, for example.

In this structure, the target means component 202 is shown constructed with a base plate 204 that has a hollow or manifold 206. The structure can be of any suitable metal that can be fabricated to the desired structure, such as for example stainless steel or the like welded, cast, etc. In this instance, the front surface of the arcuate wall 208 which is cancave and will face the drum is provided with a series of arcuate grooves, there being a plurality of circular cross-sectional bars or rods 210 mounted in these grooves. The rods 210 may be welded in place or may be clamped or otherwise tightly engaged in order to form an excellent electrical contact with the wall 208 of the base plate 204. The base plate 204 could be permanently secured to a wall such as 118, for example, and the rods 210 held in place but being removable just as shown for the two bars or rods 200 of FIG. 6. Then, as the rods 210 become consumed during the sputtering process, they can be easily replaced.

Obviously the rods 210 can be of the same metal or they could be of different metals in equal or unequal proportions. With the rods 210 close together, parallel to one another and to the axis of the drum, the plasma vapor cloud which is produced by the component 202 will be a projection of the concave area occupied by the rods 210.

In the target means component 212 of FIG. 8, instead of a liquid cooled base plate like 204, the rods 214 are hollow tubes and the coolant runs through the bores 216 of the rods. The tubes themselves form the target member in an arcuate assembly, and they may be replaceable. This will be explained in connection with FIGS. 11–13.

The target means component 218 of FIG. 9 has a base plate 220 with a hollow 222 for coolant. The consumable portion of the target means component 218 comprises a plurality of rectangular cross section bars 224 welded to the concave surface of the base plate 220. These may be of the same material or several different materials, depending upon the compound it is desired to deposit as a thin film. The drum is shown at 226 to illustrate the gap 228 within which the plasma vapor cloud will develop.

Instead of the magnetic structure which was described in connection with FIGS. 1 and 2 and which included the members 78 and 74, a simpler arrangement is used. Here there are bar magnets at 230 and 232, of opposite polarity, providing a field which is indicated by the broken lines, whose purpose is to drive secondary electrons out of the gap 228 axially along the length thereof.

These bars 224 may be clamped in position and replaceable within the scope of the invention.

The structure 234 of FIG. 10 comprises individual members 236 which may be arranged closely together to form arrays or groups or may be equally spaced around a cylindrical array, as desired. Shown in each member 236 is a hollow base 238 with internal coolant conduits 240 and a laminate 242 of the metal or other material it is desired to deposit. The laminates 242 need not be the same.

Figure 11:
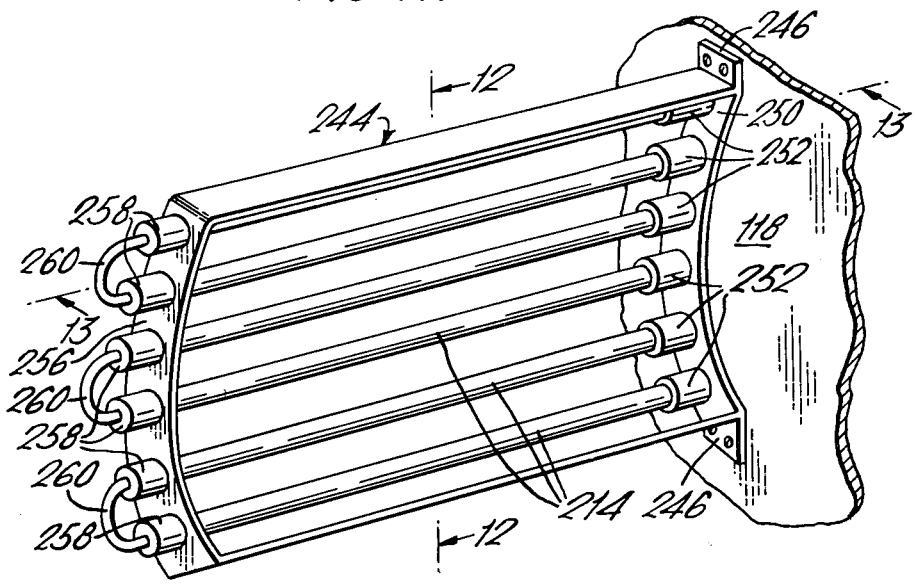
FIG. 11 is a fragmentary perspective view of an assembly of target means of a construction somewhat like that shown in FIG. 8.
Figure 12:
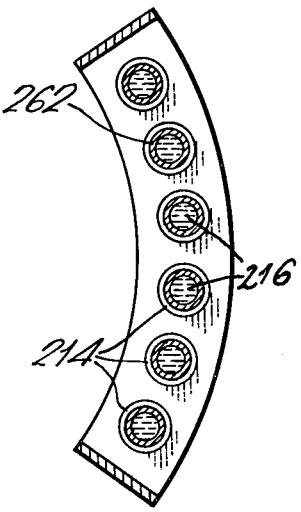
FIG. 12 is a sectional view taken generally along the line 12—12 of FIG. 11 and in the indicated direction.
Figure 13:
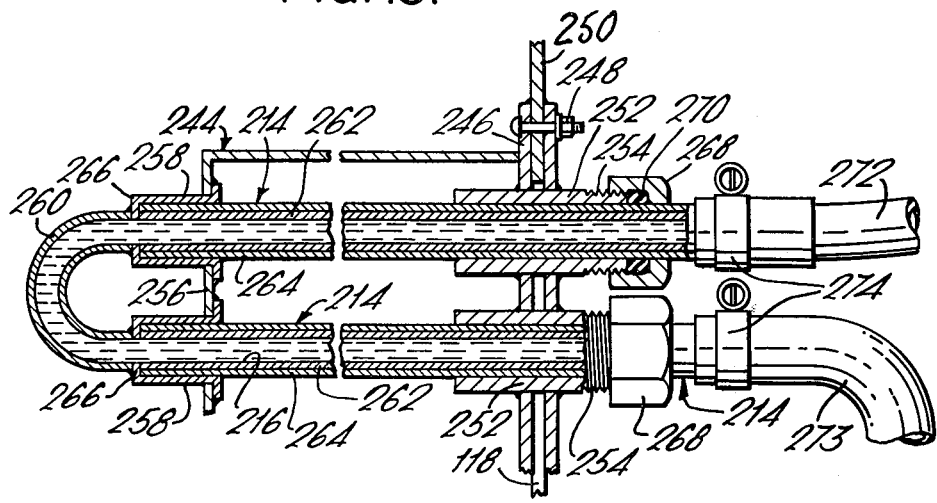
FIG. 13 is a fragmentary median sectional view taken along the plane 13—13 of FIG. 11 and in the indicated direction.

FIGS. 11–13 illustrate an arrangement using the structure 212 of FIG. 8. The rear wall of a vessel is shown at 118 having a frame 244 mounted thereto be means of the flanges 246. Simple nuts and bolts are shown at 248 as the fastening means, but it will be understood that the connection must be pressure-tight. A plurality of hollow tubes 214 is provided having the arcuate arrangement which has been explained. The side member 250 of the frame 244 has a plurality of sockets 252 which are welded in place and pass through the end wall 118, providing the rear access threaded bushings 254. The inner side member 256 of the frame 244 has sockets 258 formed thereon with return loop conduits 260 connected between sockets by welding, for example. The tubes 214 have inner metal cores 262 for strength which have the central bores 216 for carrying the coolant. The outer surfaces of the tubes 214 are clad with a laminate that is to be consumed during the sputtering process. This outer layer is designated 264 in FIG. 13. The tubes 214 in any given arrangement may have outer laminates of different materials.

The tubes 214 may be introduced through the sockets 252 and engaged into the sockets 258 against the inner shoulders 266 formed in said sockets 258. Glands 268 may be engaged tightly over the threaded bushings 254 with suitable gaskets or packing 270 in place to preserve the interior atmosphere to the left of the wall 118 in FIG. 13. Coolant conduits 272 may be coupled to the protruding ends of the tubes 214 by any suitable means such as couplings and clamps 274. Pipe 273 may lead to the next lower pair of tubes 214. Again it is important to maintain the seals between the outer atmosphere and the interior of the vessel.

The tubes 214 are easily and economically manufactured, and can be readily replaced without opening the vessel of which the wall 118 is a part.

Figure 14:
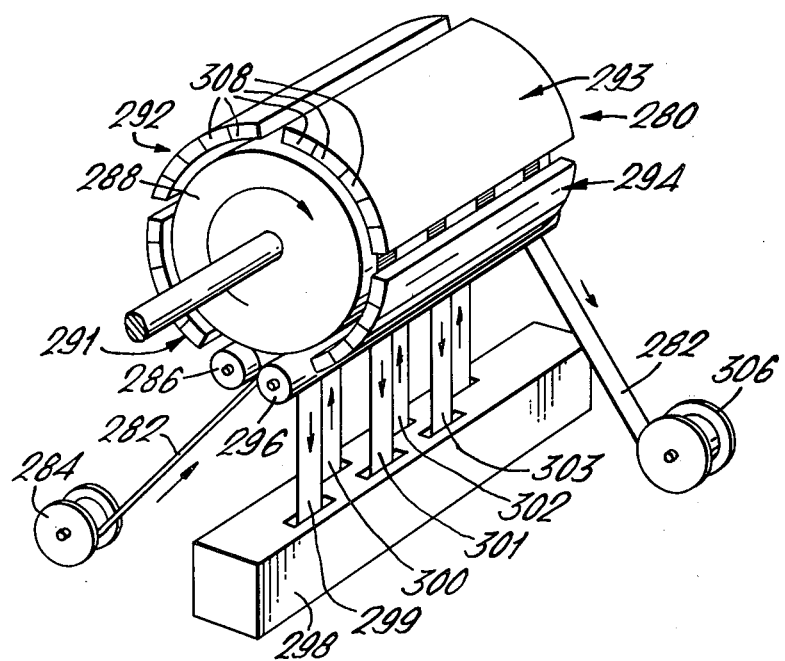
FIG. 14 is a fragmentary, perspective, diagrammatic view of a modified form of the invention.

The structure 280 of FIG. 14 is similar to others described except that the substrate member is transported by the drum through several revolutions. The illustration is easy to follow without extensive explanation. The substrate member 282 passes from the supply reel 284 around the pinch roll 286, around the drum 288 below the target members 291, 292, 293 and 294 in the first turn, around the pinch roll 296 and into the turnshifting mechansim 298 at 299. The block 298 is only diagrammatic, the details of such mechanism being described in the second copending application.

The substrate member 282 emerges at 300 from the mechanism 298 shifted a short distance axially along the drum 288. Again it makes a turn, enters 298 at 301, emerges at 302, etc. After several turns the substrate member 282 passes onto the take-up reel 306. Note that the target members are constructed of parallel bars 308. Apparatus not illustrated will be similar to that already described.

Many alternate structures can be devised and many variations made in these structures as well as in those illustrated and described herein without departing from the spirit or scope of the invention as set forth in the appended claims.

What it is desired to secure by Letters Patent of the United States is:

1. Apparatus for coating a thin film upon a substrate of flexible plastic sheeting in a pressure vessel by means of sputtering which comprises:
   A. a hermetically sealed pressure vessel,
   B. rotary supply means mounted within the vessel for carrying a supply roll of a strip of flexible plastic sheeting within the pressure vessel,
   C. rotary accumulating means mounted within the vessel for taking up the strip of flexible plastic sheeting in a roll after it has been coated,
   D. a rotary drum mounted within the vessel and having its axis parallel with the axes of the rotary supply means and the rotary accumulating means, and there being structure disposed within the vessel and arranged to guide and transport the strip of flexible polyester sheeting from the rotary supply means, and engaged with only a portion of the circumference of the rotary drum and onto the rotary accumulating means so that a roll of polyester sheeting many times longer than the circumference of the drum may be coated without opening the vessel,
   E. means for establishing a plasma vapor sputtering condition in the interior of the vessel and comprising
      i. an exterior r.f. power source,
      ii. a plurality of targets insulatedly mounted within the vessel and connected to the r.f. power source through the wall of the vessel to serve as cathodes for the plasma vapor sputtering condition, each target arranged grouped relative to other targets in a cylindrical pattern to define concave sputtering faces coaxial with the drum but radially spaced uniformly along the face outward from the drum and defining circumferentially spaced arcuate gaps between said concave sputtering faces of the target arrangements and the convex surface of the substrate when same is engaged upon the drum, plasma vapor cloud being generated within each said gap, the target arrangements being circumferentially spaced from one another and disposed relative to the drum opposite the portion of the circumference thereof which will be engaged by the strip of sheeting in passing over the drum so that when said clouds are generated they will occur between the targets sputtering faces and the strip,
      iii. means for connecting the drum to the r.f. power source thereby to enable the drum to serve as the anode for the plasma vapor sputtering condition, F. the target arrangements being disposed in an arc so that the vapor cloud segments within the gaps conform to the configuration of the gaps to form at least a portion of an arcuate belt whose curvature is generally coaxial with the drum and to provide only a radially inwardly directed particle flux component, G. means for drawing a vacuum in said vessel and for admitting at least ionizing gas into the vessel, and H. means for driving at least the accumulating means to pull the strip from the supply means and over said drum.

2. The apparatus as claimed in claim 1 in which the axial dimension of each target being substantially equal to the length of the drum whereby to present a large area for the production of said vapor cloud.

3. The apparatus as claimed in claim 2 in which the targets are adjustably mounted to permit adjustment of the gap of each from the exterior of said vessel.

4. The apparatus as claimed in claim 2 in which each target has metal backing means to provide for the mounting thereof and at least said metal backing means have coolant carrying chambers connected with a source of coolant on the exterior of the vessel.

5. The apparatus as claimed in claim 2 in which each target is made up of a plurality of pieces mounted on a metal backing to form a composite target surface.

6. The apparatus as claimed in claim 2 in which each target is made up of a plurality of pieces mounted on a backing of metal to form a composite target surface and in which the surfaces of the individual pieces are flat but the composite surface is substantially cylindrical and has a curvature generally coaxial with the drum.

7. The apparatus as claimed in claim 2 in which the drum has a chamber formed within its exterior surface and means are provided for circulating heat-exchange liquid in said chamber from a source exterior of the vessel.

8. The apparatus as claimed in claim 1 in which the targets are adjustably mounted to permit adjustment of the gap of each from the exterior of said vessel.

9. The apparatus as claimed in claim 1 in which each target has metal backing means to provide for the mounting thereof and at least said metal backing means have coolant carrying chambers connected with a source of coolant on the exterior of the vessel.

10. The apparatus as claimed in claim 1 in which each target is made up of a plurality of pieces mounted on a metal backing to form a composite target surface.

11. The apparatus as claimed in claim 1 in which each target is made up of a plurality of pieces mounted on a backing of metal to form a composite target surface and in which the surfaces of the individual pieces are flat but the composite surface is substantially cylindrical and has a curvature generally coaxial with the drum.

12. The apparatus as claimed in claim 1 in which the drum has a chamber formed within its exterior surface and means are provided for circulating heat-exchange liquid in said chamber from a source exterior of the vessel.

13. Apparatus for coating a thin film upon a substrate of flexible plastic sheeting in a pressure vessel by means of sputtering which comprises:

A. a hermetically sealed pressure vessel,

B. rotary supply means mounted within the vessel for carrying a supply roll of a strip of flexible plastic sheeting within the pressure vessel, C. rotary accumulating means mounted within the vessel for taking up the strip of flexible plastic sheeting in a roll after it has been coated, D. a rotary drum mounted within the vessel and having its axis parallel with the axes of the rotary supply means and the rotary accumulating means, and there being structure disposed within the vessel and arranged to guide and transport the strip of flexible plastic sheeting from the rotary supply means, over only a portion of the circumference of the rotary drum and onto the rotary accumulating means so that a roll of plastic sheeting many times longer than the circumference of the drum may be coated without opening the vessel, E. means for establishing a plasma vapor sputtering condition in the interior of the vessel and comprising
  i. an exterior r.f. power source,
  ii. a plurality of targets insulatedly mounted within the vessel and connected to the r.f. power source through the wall of the vessel to serve as cathodes for the plasma vapor sputtering condition, the targets are arranged in a cylindrical pattern coaxial with the drum but radially spaced outwardly from the drum to form a gap within which plasma vapor cloud will be generated, the targets being circumferentially spaced from one another and disposed relative to the drum opposite the portion of the circumference thereof which will be engaged by the strip of plastic sheeting in passing over the drum so that when said clouds are generated they will occur between the targets and the strip,
  iii. means for connecting the drum to the r.f. power source thereby to enable the drum to serve as the anode for the plasma vapor sputtering condition, F. the targets being arranged in an arc so that the vapor cloud segments form at least a portion of an arcuate belt whose curvature is generally coaxial with the drum, G. means for drawing a vacuum in said vessel and for admitting at least ionizing gas into the vessel, and H. means for driving at least the accumulating means to pull the strip from the supply means and over said drum, said targets being adjustably mounted to permit adjustment of the gap of each from the exterior of said vessel.

14. Apparatus for coating a thin film upon a substrate of flexible plastic sheeting in a pressure vessel by means of sputtering which comprises:

A. a hermetically sealed pressure vessel,

B. rotary supply means mounted within the vessel for carrying a supply roll of a strip of flexible plastic sheeting within the pressure vessel, C. rotary accumulating means mounted within the vessel for taking up the strip of flexible plastic sheeting in a roll after it has been coated, D. a rotary drum mounted within the vessel and having its axis parallel with the axes of the rotary supply means and the rotary accumulating means, and there being structure disposed within the vessel and arranged to guide and transport the strip of flexible plastic sheeting from the rotary supply means, over only a portion of the circumference of the rotary drum and onto the rotary accumulating means so that a roll of plastic sheeting many times longer than the circumference of the drum may be coated without opening the vessel,
E. means for establishing a plasma vapor sputtering condition in the interior of the vessel and comprising
  i. an exterior r.f. power source,
  ii. a plurality of targets insulatedly mounted within the vessel and connected to the r.f. power source through the wall of the vessel to serve as cathodes for the plasma vapor sputtering condition, the targets are arranged in a cylindrical pattern coaxial with the drum but radially spaced outwardly from the drum to form a gap within which plasma vapor cloud will be generated, the targets being circumferentially spaced from one another and disposed relative to the drum opposite the portion of the circumference thereof which will be engaged by the strip of plastic sheeting in passing over the drum so that when said clouds are generated they will occur between the targets and the strip,
  iii. means for connecting the drum to the r.f. power source thereby to enable the drum to serve as the anode for the plasma vapor sputtering condition,
F. the targets being arranged in an arc so that the vapor cloud segments form at least a portion of an arcuate belt whose curvature is generally coaxial with the drum,
G. means for drawing a vaccum in said vessel and for admitting at least ionizing gas into the vessel,
H. means for driving at least the accumulating means to pull the strip from the supply means and over said drum, the axial dimension of each target being substantially equal to the length of the drum whereby to present a large area for the production of said vapor cloud, the targets being adjustably mounted to permit adjustment of the gap of each from the exterior of said vessel.

* * * * *

UNITED STATES PATENT AND TRADEMARK OFFICE
CERTIFICATE OF CORRECTION

PATENT NO. : 4,026,787
DATED : May 31, 1977
INVENTOR(S) : MANFRED R. KUEHNLE

It is certified that error appears in the above-identified patent and that said Letters Patent are hereby corrected as shown below:

Col. 4, line 20, change "rations" to --ratios--;

change "if" to --is--; Col. 9, line 34, change "raido" to --radio--; Col. 10, line 25, change "or" to --of--; Col. 10, line 30, change "and" to --an--; Col. 15, line 26, change "be" to --by--; Col. 16, line 2, change "mechanism" to --mechanisms--

Signed and Sealed this

Twenty-seventh Day of September 1977

[SEAL]

Attest:

RUTH C. MASON
Attesting Officer

LUTRELLE F. PARKER
Acting Commissioner of Patents and Trademarks